(12) United States Patent
Kim et al.

(10) Patent No.: US 12,166,158 B2
(45) Date of Patent: Dec. 10, 2024

(54) COLOR CONVERSION PANEL AND DISPLAY DEVICE INCLUDING THE SAME

(71) Applicant: Samsung Display Co., LTD., Yongin-si (KR)

(72) Inventors: Jeong Ki Kim, Hwaseong-si (KR); Kang Soo Han, Seoul (KR); Jong-Hoon Kim, Seoul (KR); Hwa Yeul Oh, Hwaseong-si (KR); Hye Jun Woo, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 393 days.

(21) Appl. No.: 17/526,501

(22) Filed: Nov. 15, 2021

(65) Prior Publication Data
US 2022/0231200 A1 Jul. 21, 2022

(30) Foreign Application Priority Data

Jan. 19, 2021 (KR) .......................... 10-2021-0007571

(51) Int. Cl.
*H01L 33/50* (2010.01)
(52) U.S. Cl.
CPC .................................. *H01L 33/502* (2013.01)
(58) Field of Classification Search
CPC ................. H01L 33/502; H01L 33/505; H01L 2933/0091; H01L 33/504; H10K 59/38; H10K 50/865; H10K 2102/331; H10K 50/854; H10K 59/12; H10K 59/877; H10K 59/8792; G02B 5/206; G02B 1/02; G02B 5/0242; G02B 6/0026

See application file for complete search history.

(56) References Cited

U.S. PATENT DOCUMENTS

| | | | |
|---|---|---|---|
| 2016/0161066 A1* | 6/2016 | Sung | C09K 11/703 252/301.36 |
| 2018/0100956 A1* | 4/2018 | Lee | G02B 5/204 |
| 2019/0121176 A1* | 4/2019 | Lee | G02F 1/1336 |
| 2020/0075816 A1* | 3/2020 | Cheng | H01L 25/0753 |

FOREIGN PATENT DOCUMENTS

| | | |
|---|---|---|
| KR | 10-2016-0017373 | 2/2016 |
| KR | 10-2018-0018945 | 2/2018 |
| KR | 10-2020-0086413 | 7/2020 |
| KR | 10-2020-0117093 | 10/2020 |

* cited by examiner

*Primary Examiner* — Jonathan Han
(74) *Attorney, Agent, or Firm* — KILE PARK REED & HOUTTEMAN PLLC

(57) ABSTRACT

A color conversion panel includes light blocking members spaced apart from each other on a substrate; and a first color conversion layer, a second color conversion layer, and a transmission layer respectively disposed between the light blocking members, wherein the transmission layer includes first quantum dots, and the first quantum dots convert incident light into light having a wavelength in a range of about 480 nm to about 530 nm.

18 Claims, 8 Drawing Sheets

230 : 230R, 230G, 230B

230 : 230R, 230G, 230B

COLOR CONVERSION PANEL AND DISPLAY DEVICE INCLUDING THE SAME

CROSS-REFERENCE TO RELATED APPLICATION(S)

This application claims priority to and benefits of Korean Patent Application No. 10-2021-0007571 under 35 U.S.C. § 119 filed on Jan. 19, 2021 in the Korean Intellectual Property Office, the entire contents of which are incorporated herein by reference.

BACKGROUND

1. Technical Field

The disclosure relates to a color conversion panel and a display device including the same.

2. Description of the Related Art

A light emitting element is an element in which holes supplied from an anode and electrons supplied from a cathode are combined in an organic emission layer to form excitons, and light is emitted while the excitons are stabilized.

The light emitting element has several merits such as a wide viewing angle, a fast response speed, a thin thickness, and lower power consumption such that the light emitting diode is widely applied to various electrical and electronic devices such as a television, a monitor, a mobile phone, etc.

Recently, a display device including a color conversion panel has been proposed to implement a display device with high efficiency. The color conversion panel converts incident light into different colors. The incident light may be blue light, and the blue light may be color-converted into red and green, respectively, or transmitted as blue light itself. Therefore, the red color conversion layer and the green color conversion layer may include quantum dots for the color conversion, and the transmission layer may not include separate quantum dots.

The above information disclosed in this background section is only for enhancement of understanding of the background of the disclosure, and therefore it may contain information that may not form the prior art that may already be known to a person of ordinary skill in the art.

SUMMARY

Embodiments provide a color conversion panel with improved side visibility and a display device including the same.

A color conversion panel according to an embodiment may include; light blocking members spaced apart from each other on a substrate; and a first color conversion layer, a second color conversion layer, and a transmission layer respectively disposed between the light blocking members, wherein the transmission layer may include first quantum dots, and the first quantum dots convert incident light into light having a wavelength in a range of about 480 nm to about 530 nm.

The second color conversion layer may include second quantum dots, and the second quantum dots may convert incident light into light having a wavelength in a range of about 430 nm to about 680 nm.

The first color conversion layer may include third quantum dots, and the third quantum dots may convert the incident light into light having a wavelength in a range of about 600 nm to about 650 nm.

A content of the first quantum dots included in the transmission layer may be less than a content of the second quantum dots included in the second color conversion layer and a content of the third quantum dots included in the first color conversion layer.

The first color conversion layer, the second color conversion layer, and the transmission layer may further include a scattering member, respectively, and a content of the scattering member included in the first color conversion layer and a content of the second color conversion layer may be less than the content of the scattering member of the transmission layer.

The scattering member may include $TiO_2$.

A size of the first quantum dots may be smaller than a size of the second quantum dots, and the size of the second quantum dots may be smaller than a size of the third quantum dots.

A content of the first quantum dots may be in a range of about 20 wt % to about 30 wt % of the transmission layer.

The transmission layer may further include $TiO_2$, and a content of the $TiO_2$ may be in a range of about 5 wt % to about 6 wt % of the transmission layer.

The color conversion panel may further include a first color filter disposed between the substrate and the first color conversion layer; a second color filter disposed between the substrate and the second color conversion layer; and a third color filter disposed between the substrate and the transmission layer.

The color conversion panel may further include a dummy color filter overlapping the light blocking members in a direction perpendicular to surface of the substrate, the dummy color filter and the third color filter may be disposed on a same layer, wherein the third color filter and the dummy color filter may be blue color filters.

The color conversion panel may further include a low refraction layer disposed between the first, second, and third color filters, and the first and second color conversion layers and the transmission layer.

The color conversion panel may further include a low refraction capping layer contacting the low refraction layer.

A display device according to an embodiment may include a color conversion panel; and a display panel overlapping the color conversion panel, wherein the display panel emits blue light, and the color conversion panel may include light blocking members spaced apart from each other on a substrate; a first color conversion layer, a second color conversion layer, and a transmission layer respectively disposed between the light blocking members, and the transmission layer may include first quantum dots, and the first quantum dots convert the blue light from the display panel into light having a wavelength in a range of about 480 nm to about 530 nm.

The second color conversion layer may include second quantum dots, the second quantum dots may convert the incident blue light into light having a wavelength in a range of about 480 nm to about 560 nm, the first color conversion layer may include third quantum dots, and the third quantum dots convert the incident blue light into light having a wavelength in a range of about 600 nm to about 650 nm.

A content of the first quantum dots included in the transmission layer may be less than a content of the second quantum dots included in the second color conversion layer and a content of the third quantum dots included in the first color conversion layer.

The first color conversion layer, the second color conversion layer, and the transmission layer may further include a scattering member, respectively, and a content of the scattering member included in the first color conversion layer and a content of the second color conversion layer may be less than a content of the scattering member of the transmission layer.

A size of the first quantum dots may be smaller than a size of the second quantum dots, and the size of the second quantum dots may be smaller than a size of the third quantum dots.

A content of the first quantum dots may be in a range of about 20 wt % to about 30 wt % of the transmission layer.

The transmission layer may further include $TiO_2$, and a content of the $TiO_2$ may be in a range of about 5 wt % to about 6 wt % of the transmission layer.

According to an embodiment, the color conversion panel with improved side visibility and the display device including the same are provided.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
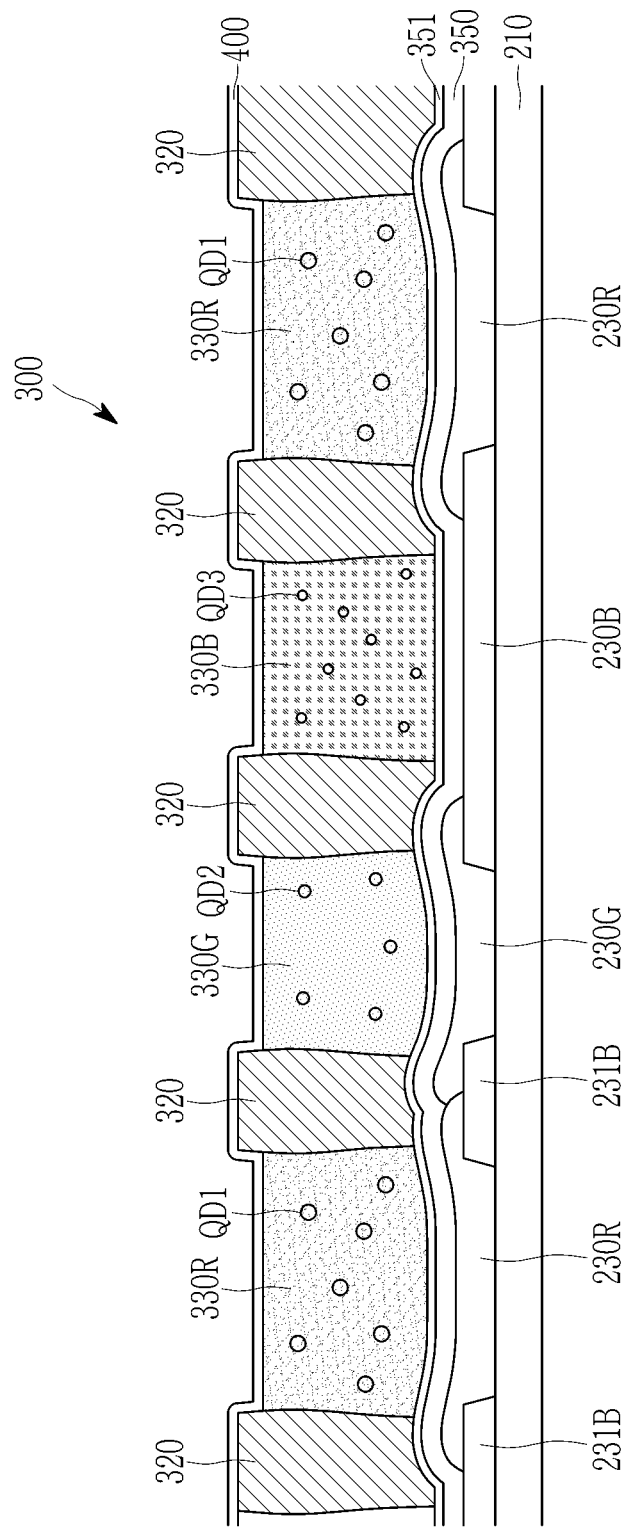
FIG. 1 is a schematic cross-sectional view schematically showing a color conversion panel according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

For example, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

In addition, unless explicitly described to the contrary, the word "comprises," "comprising," "includes," and/or "including,", "has," "have," and/or "having," and variations thereof when used in this specification, will be understood to imply the inclusion of stated elements but not the exclusion of any other elements.

Further, in the specification, the phrase "in a plan view" means when an object portion is viewed from above, and the phrase "on a cross-section" means when a cross-section taken by vertically cutting an object portion is viewed from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A color conversion panel and a display device including the same according to an embodiment are described with reference to accompanying drawings.

FIG. 1 is a schematic cross-sectional view schematically showing a color conversion panel according to an embodiment. Referring to FIG. 1, a color conversion panel 300 according to an embodiment may include a blue color filter 230B disposed on a first substrate 210. A dummy color filter 231B may be positioned or disposed on a same layer as the blue color filter 230B. The dummy color filter 231B may be disposed to be spaced apart from the blue color filter 230B, and the dummy color filter 231B and the blue color filter 230B may be formed through the same process and may include the same material or similar material.

A red color filter 230R may be disposed between dummy color filters 231B. A green color filter 230G may be disposed between the red color filter 230R and the blue color filter 230B.

A low refraction layer 350 and a low refraction capping layer 351 may be disposed on the color filters 230R, 230G, and 230B and the dummy color filter 231B. The low refraction layer 350 may include a material having a low refractive index, and the low refraction capping layer 351 may be positioned or disposed on the low refraction layer 350.

A light blocking member 320 may be positioned or disposed on the low refraction capping layer 351. Light blocking members 320 may be positioned or disposed to be spaced apart from each other via openings therebetween, and each of the openings may overlap each color filter 230R, 230G, and 230B in a direction perpendicular or substantially perpendicular to the surface of the first substrate 210.

The red color conversion layer 330R, the green color conversion layer 330G, and the transmission layer 330B are positioned or disposed in the regions between the light blocking member 320 spaced apart from each other. As shown in FIG. 1, a red color conversion layer 330R, a green color conversion layer 330G, and a transmission layer 330B may be positioned or disposed in a space partitioned by the light blocking members 320, respectively. A capping layer 400 may be positioned or disposed on the red color conversion layer 330R, the green color conversion layer 330G, and the transmission layer 330B.

The light blocking member 320 may include a black material. The red color conversion layer 330R overlaps the red color filter 230R in a direction perpendicular to the surface of the first substrate 210, and the green color conversion layer 330G overlaps the red color filter 230G in the direction perpendicular to the surface of the first substrate 210. The transmission layer 330B may be disposed to overlap the blue color filter 230B in the direction perpendicular to the surface of the first substrate 210.

The red color conversion layer 330R may convert the supplied blue light to red light. For this, the red color conversion layer 330R may include first quantum dots QD1. The first quantum dots QD1 may convert the incident blue light into red light. For example, a maximum emission peak wavelength of light emitted by the first quantum dots QD1 may be about 600 nm or more, for example, about 610 nm or more, about 615 nm or more, or about 620 nm or more, and about 650 nm or less, about 645 nm or less, about 640 nm or less, about 635 nm or less, or about 630 nm or less.

The diameter of the first quantum dots QD1 may be in a range of about 5 nm to about 6 nm. However, this is only an example and it is not limited thereto. Among the red color conversion layer 330R, the content of the first quantum dots QD1 may be in a range of about 30 wt % to about 50 wt %. The red color conversion layer 330R may include $TiO_2$. Among the red color conversion layer 330R, the content of $TiO_2$ may be in a range of about 4 wt % to about 5 wt %.

The green color conversion layer 330G may convert the supplied blue light to green light. The green color conversion layer 330G may include a second quantum dots QD2. The second quantum dots QD2 may convert the incident blue light into green light. For example, the second quantum dots QD2 may convert the incident light into light having a wavelength in a range of about 430 nm to about 680 nm. At this time, the maximum emission peak wavelength of light emitted by the second quantum dots QD2 may be about 480 nm or more, for example, about 500 nm or more, about 510 nm or more, about 520 nm or more, or about 530 nm or more, and about 560 nm or less, about 550 nm or less, about 545 nm or less, about 540 nm or less, or about 535 nm or less.

The diameter of the second quantum dots QD2 may be in a range of about 3 nm to about 4 nm. However, this is only an example and it is not limited thereto. Among the green color conversion layer 330G, the content of the second quantum dots QD2 may be in a range of about 30 wt % to about 50 wt %. The green color conversion layer 330G may include $TiO_2$. Among the green color conversion layer 330G, the content of $TiO_2$ may be in a range of about 4 wt % to about 5 wt %.

The transmission layer 330B transmits the incident blue light. The transmission layer may include a transparent polymer, and the supplied blue light is transmitted and represents blue. The transmission layer 330B corresponding to the region emitting blue light may include third quantum dots QD3.

At this time, the third quantum dots QD3 may convert the incident blue light into a wavelength in a range of about 480 nm to about 530 nm. At this time, the wavelength region for the color conversion of the third quantum dots QD3 may partially overlap with the wavelength range for the color conversion of the second quantum dot QD2. The diameter of the third quantum dots QD3 may be in a range of about 2 nm to about 3 nm. The content of the third quantum dots QD3 may be in a range of about 20 wt % to about 30 wt %. It is explained separately later, but the wavelength of the color emitted by the third quantum dots QD3 may correspond to the wavelength of the overlapping region of the spectrum of the blue light and the spectrum of the green light. The transmission layer 330B may include a scattering member, and the scattering member may be $TiO_2$. Among the transmission layer 330B, the content of $TiO_2$ may be in a range of about 5 wt % to about 6 wt %. $TiO_2$ included in the transmission layer 330B may improve front/side visibility by turning the direction of the incident blue light to the side. The third quantum dots QD3 included in the transmission layer 330B emit the color-converted light in all directions, thereby contributing to improving the side visibility along with the $TiO_2$. There may be a difference in the display quality for each region according to the concentration gradient of $TiO_2$ in the transmission layer 330B, but it may be offset while the third quantum dots QD3 included in the transmission layer 330B emit light in all directions. The effect due to the introduction of the third quantum dots QD3 is separately described in detail later.

For example, the content of the third quantum dots QD3 of the transmission layer 330B may be smaller or less than the content of the first quantum dots QD1 of the red color conversion layer 330R or the content of the second quantum dots QD2 of the green color conversion layer 330G. The content of $TiO_2$ of the transmission layer 330B may be greater than the content of $TiO_2$ of the red color conversion layer 330R or the green color conversion layer 330G.

In the following, the quantum dots are first described in detail. The first quantum dot QD1, the second quantum dot QD2, and the third quantum dot QD3 may each have features described below.

In the specification, the quantum dots (hereinafter, referred to as semiconductor nanocrystals) may include a Group II-VI compound, a Group III-V compound, a Group IV-VI compound, a Group IV element or compound, a Group compound, a Group compound, a Group I-II-IV-VI compound, or combinations thereof.

The Group II-VI compound may be selected from a group including a binary compound selected from a group consisting of CdSe, CdTe, ZnS, ZnSe, ZnTe, ZnO, HgS, HgSe, HgTe, MgSe, MgS, and a mixture thereof; a ternary compound selected from a group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group II-VI compound may further include a Group III metal.

The Group III-V compound may be selected from a group including a binary compound selected from a group consisting of GaN, GaP, GaAs, GaSb, AlN, AlP, AlAs, AlSb, InN, InP, InAs, InSb, and a mixture thereof; a ternary compound selected from a group consisting of GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and a mixture thereof; and a quaternary compound selected from a group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a mixture thereof. The Group III-V compound may further include a Group II metal (for example, InZnP).

The Group IV-VI compound may be selected from a group including a binary compound selected from a group consisting of SnS, SnSe, SnTe, PbS, PbSe, PbTe, and a mixture thereof; a ternary compound selected from a group consisting of SnSeS, SnSeTe, SnSTe, PbSeS, PbSeTe, PbSTe, SnPbS, SnPbSe, SnPbTe, and a mixture thereof; and a quaternary compound selected from a group consisting of SnPbSSe, SnPbSeTe, SnPbSTe, and a mixture thereof.

The Group IV element or compound may be selected from a group including a single element compound selected from a group consisting of Si, Ge, and combinations thereof; and a binary element compound selected from a group consisting of SiC, SiGe, and combinations thereof.

The Group compound may include $CuInSe_2$, $CuInS_2$, CuInGaSe, and CuInGaS, however it is not limited thereto. The Group I-II-IV-VI compound may include CuZnSnSe and CuZnSnS, however it is not limited thereto. The Group IV element or compound may be selected from a group including a single element compound selected from a group consisting of Si, Ge, and combinations thereof; and a binary element compound selected from a group consisting of SiC, SiGe, and combinations thereof.

The Group compound may be selected from a group consisting of ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAl S, HgInS, HgGaSe, HgAlSe, HgInSe, HgGaTe, HgAlTe, HgInTe, MgGaS, MgAl S, MgInS, MgGaSe, MgAl Se, MgInSe, and combinations thereof.

The Group I-II-IV-VI compound may be selected from CuZnSnSe and CuZnSnS, however it is not limited thereto.

In an embodiment, the quantum dots may not include cadmium. The quantum dots may include a semiconductor nanocrystal based on a Group III-V compound including indium and phosphorus. The Group III-V compound may further include zinc. The quantum dots may include a semiconductor nanocrystal based on a Group II-VI compound including a chalcogen element (for example, sulfur, selenium, tellurium, or combinations thereof) and zinc.

In the quantum dots, the binary compound, the ternary compound, or the quaternary compound as above-described may be present in the particle at a uniform concentration or in the same particle of which a concentration distribution may be partially divided into different states. Also, they may have a core/shell structure in which one quantum dot surrounds another quantum dot. The interface between the core and the shell may have a concentration gradient in which the concentration of the elements present in the shell decreases toward the center.

In an embodiment, the quantum dots may have a core-shell structure including a core including the above-described nanocrystal and a shell surrounding the core. The shell of the quantum dot may act as a protective layer for maintaining the semiconductor characteristic by preventing a chemical modification of the core and/or a charging layer for imparting an electrophoretic characteristic to the quantum dot. The shell may be single-layered or multi-layered. The interface between the core and the shell may have a concentration gradient in which the concentration of elements present in the shell decreases toward the center. Examples of the shell of the quantum dot include a metal or non-metal oxide, a semiconductor compound, or a combination thereof.

For example, the metal or non-metal oxide may be a binary compound such as $SiO2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$, or a ternary compound such as $MgAl_2O_4$, $CoFe_2O_4$, $NiFe_2O_4$, and $CoMn_2O_4$, however the disclosure is not limited thereto.

Also, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, however the disclosure is not limited thereto.

An interface between the core and the shell may have a concentration gradient, such that the concentration of an element existing in the shell is gradually reduced as it nears the center thereof. The semiconductor nanocrystals may have a structure including one semiconductor nanocrystal core and multi-layered shells surrounding the core. In an embodiment, the multi-layered shells may have two or more layers, for example, two, three, four, five, or more layers. Two adjacent layers of the shell may have a single composition or different compositions. In the multi-layered shell, each layer may have a composition that varies along the radius.

The quantum dots may have a full width at half maximum (FWHM) of about 45 nm or less, about 40 nm or less, or about 30 nm or less, and may improve color purity or color reproducibility in this range. Also, since light emitted through the quantum dots is emitted in all directions, a wide viewing angle may be improved.

In the quantum dots, the shell material and the core material may have different energy bandgaps from each other. For example, the energy bandgap of the shell material may be greater than that of the core material. As an example, the energy bandgap of the shell material may be smaller than that of the core material. The quantum dots may have a multi-layered shell. In the multi-layered shell, the energy bandgap of the outer layer may be greater than the energy bandgap of the inner layer (for example, the layer nearer to the core). In the multi-layered shell, the energy bandgap of the outer layer may be less than the energy bandgap of the inner layer.

The quantum dots may control an absorption/emission wavelength by adjusting a composition and a size thereof. A maximum peak emission wavelength of the quantum dot may be an ultraviolet (UV) to infrared wavelength, or a wavelength of greater than the above wavelength range.

The quantum dot may have quantum efficiency of about 10% or more, for example, about 30% or more, about 50% or more, about 60% or more, about 70% or more, about 90% or more, or even 100%. The quantum dots can have a relatively narrow spectrum. The quantum dots may have a full width at half maximum of a light emission wavelength spectrum of, for example, about 50 nm or less, about 45 nm or less, about 40 nm or less, or about 30 nm or less.

The quantum dots may have a particle size of about 1 nm or more and about 100 nm or less. The size of the particle refers to the diameter of the particle or the diameter converted by assuming a sphere from a 2D image obtained by an analysis with a transmission electron microscope. The quantum dots may have the size in a range of about 1 nm to about 20 nm, for example, about 2 nm or more, about 3 nm or more, or about 4 nm or more, and about 50 nm or less, and about 40 nm or less, about 30 nm or less, about 20 nm or less, about 15 nm or less, or about 10 nm or less. The shape of the quantum dots is not specially limited. For example, the shape of the quantum dots may include substantially a sphere, substantially a polyhedron, substantially a pyramid, substantially a multi-pod, substantially a square, substantially a cuboid, substantially a nanotube, substantially a nanorod, substantially a nanowire, substantially a nanosheet, or a combination thereof, but is not limited thereto.

The quantum dots may be commercially available or may be synthesized appropriately. For the quantum dots, the particle size may be controlled relatively freely during a colloid synthesis and the particle size may also be uniformly controlled.

The quantum dots may include an organic ligand (for example, having a hydrophobic moiety). The organic ligand moiety may be bound to surfaces of the quantum dots. The organic ligand moiety may include RCOOH, $RNH_2$, $R_2NH$, $R_3N$, RSH, $R_3PO$, $R_3P$, ROH, RCOOR, RPO $(OH)_2$, RHPOOH, $R_2POOH$, or combinations thereof, and herein, R is independently a C3 to C40 substituted or unsubstituted aliphatic hydrocarbon group such as a C3 to C40 (for example, C5 or greater and C24 or smaller) substituted or unsubstituted alkyl, or a substituted or unsubstituted alkenyl, a C6 to C40 (for example, C6 or greater and C20 or smaller) substituted or unsubstituted aromatic hydrocarbon group such as a substituted or unsubstituted C6 to C40 aryl group, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octylphosphine, dioctyl phosphine, tributylphosphine, or trioctylphosphine; a phosphine compound or an oxide compound thereof such as methyl phosphine oxide, ethyl phosphine oxide, propyl phosphine oxide, butyl phosphine oxide pentyl phosphine oxide, tributylphosphine oxide, octylphosphine oxide, dioctyl phosphine oxide, or trioctylphosphine oxide; a diphenyl phosphine, a triphenyl phosphine compound, or an oxide compound thereof; a C5 to C20 alkyl phosphonic acid such as hexylphosphinic acid, octylphosphinic acid, dodecanephosphinic acid, tetradecanephosphinic acid, hexadecanephosphinic acid, or octadecanephosphinic acid; and the like, but are not limited thereto. The quantum dots may include a hydrophobic organic ligand alone or in a mixture of at least two types thereof. The hydrophobic organic ligand may not include a photopolymerizable moiety (for example, an acrylate group, a methacrylate group, etc.).

The effect of the color conversion panel in which the third quantum dots QD3 is included in the transmission layer 330B according to an embodiment is described.

The red color conversion layer 330R and the green color conversion layer 330G in the color conversion panel convert the incident blue light into red light by including the quantum dots. The transmission layer 330B transmits blue light and does not color-convert separately. At this time, since the quantum dots for the color conversion are not included in the transmission layer 330B, a scattering member may be included instead of the quantum dots. The scattering member used at this time may be $TiO_2$.

Figure 2:
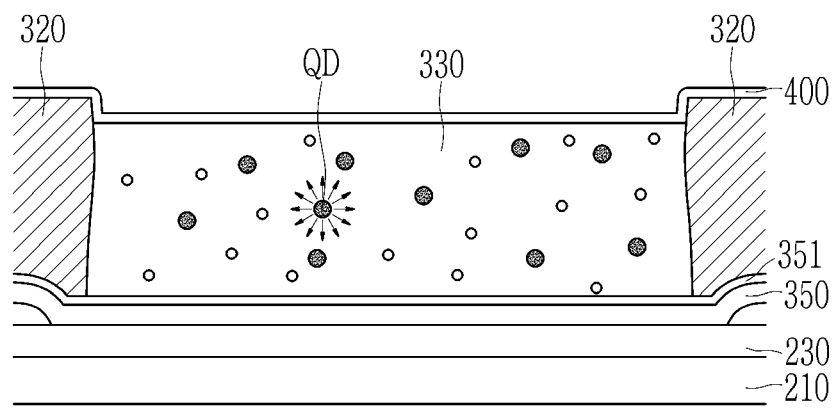
FIG. 2 is a view showing a configuration in which light is emitted in all directions by quantum dots in a color conversion layer including quantum dots QD.
Figure 3:
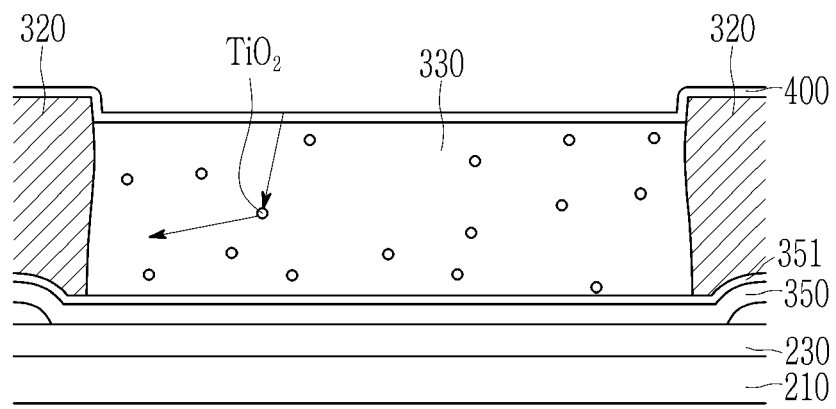
FIG. 3 is a view showing a path of light in a transmission layer including $TiO_2$.

Since the quantum dots emit light in all directions, they may reduce the difference between the front visibility and the side visibility. FIG. 2 shows the configuration in which light is emitted in all directions by the quantum dots in the color conversion layer 330 including the quantum dots QD. As shown in FIG. 2, the quantum dots QD emit light in all directions, so they may produce the same display quality no matter whether it is being viewed from the front or the side. In FIGS. 2 and 3, a color filter 230 may include 230R, 230G, and/or 230B.

However, in the case of the transmission layer 330B that may not include the quantum dots, light is transmitted in only one direction or a direction due to the straightness of the light. Therefore, there is a problem that there is a difference in the front visibility and the side visibility, the light is dispersed by including the scattering member in the transmission layer 330B. In the case of the scattering member such as $TiO_2$, the difference in the front/side luminance may be reduced by converting the light traveling in the front direction to the side.

FIG. 3 is a view showing a path of light in a transmission layer in $TiO_2$. As shown in FIG. 3, the light incident on the straight line is diverted through $TiO_2$ and emitted to the side. Therefore, a WAD characteristic may be improved by reducing the difference in the front/side luminance.

However, in the case of the transmission layer 330B that does not include the quantum dots and may include only $TiO_2$, since the dependence of $TiO_2$ is large, the occurrence rate of defects due to the content deviation of $TiO_2$ for each position may be high. In the transmission layer 330B, a difference in the display quality occurs between a region with the high content $TiO_2$ and a region with the low content $TiO_2$, which may be recognized as bright line/dark lines or divided into strong/weak visibility regions on the panel.

However, in the display device according to an embodiment, the transmission layer 330B may include the third quantum dots QD3. The third quantum dots QD3 may emit light having the wavelength of the spectrum overlapping region of light emitted from the transmission layer 330B and light emitted from the green color conversion layer 330G, and the light incident into the transmission layer 330B is dispersed in the several directions by the third quantum dots QD3, thereby improving the front/side visibility.

The wavelength of light that is color-converted by the third quantum dots QD3 is described in detail.

Figure 4:
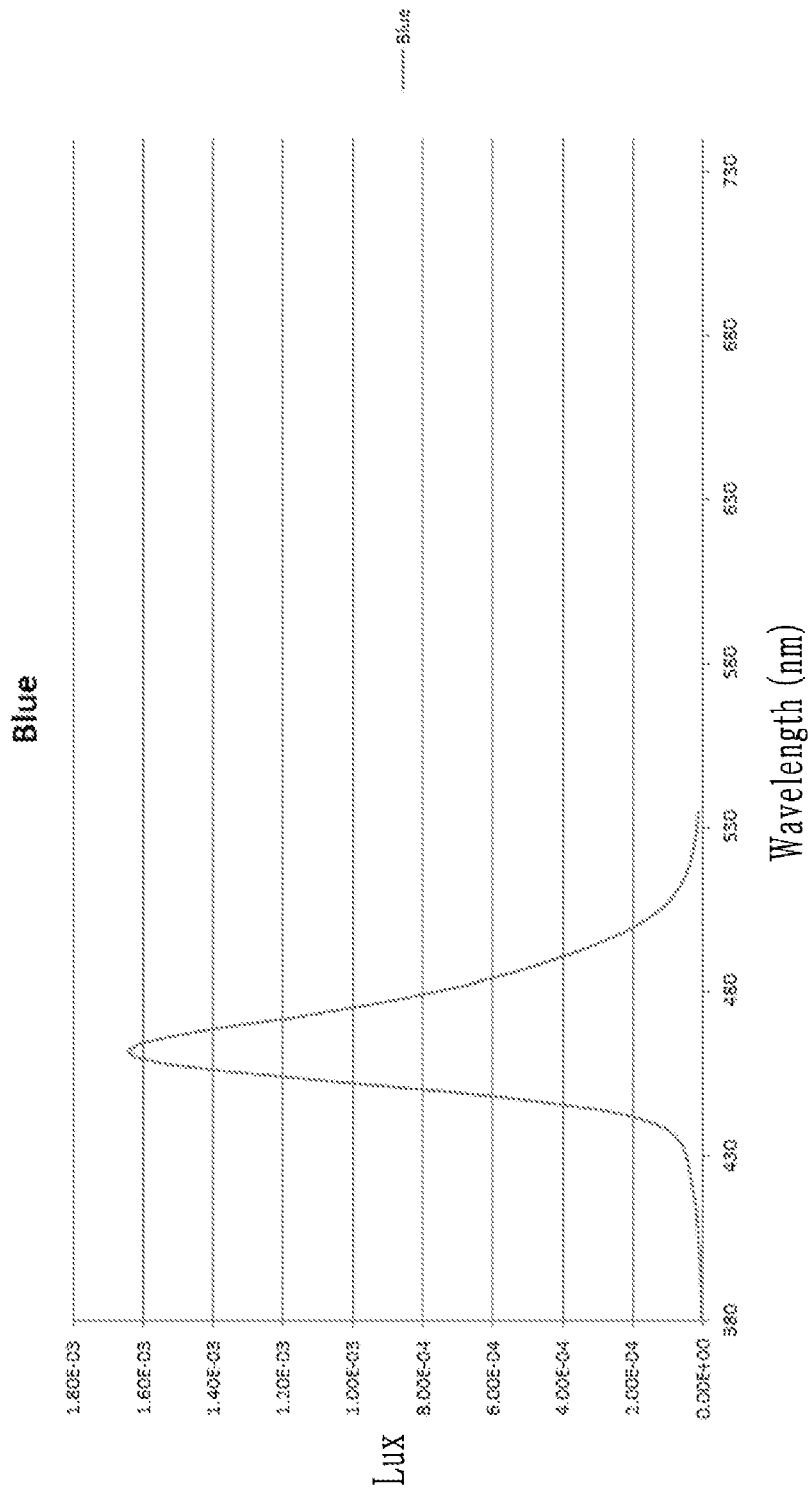
FIG. 4 is a view showing a spectrum of blue light.

FIG. 4 shows the spectrum of blue light. Referring to FIG. 4, it may be observed that the blue light has a wavelength in a range of about 430 nm to about 530 nm and a peak is formed at about 470 nm.

Figure 5:
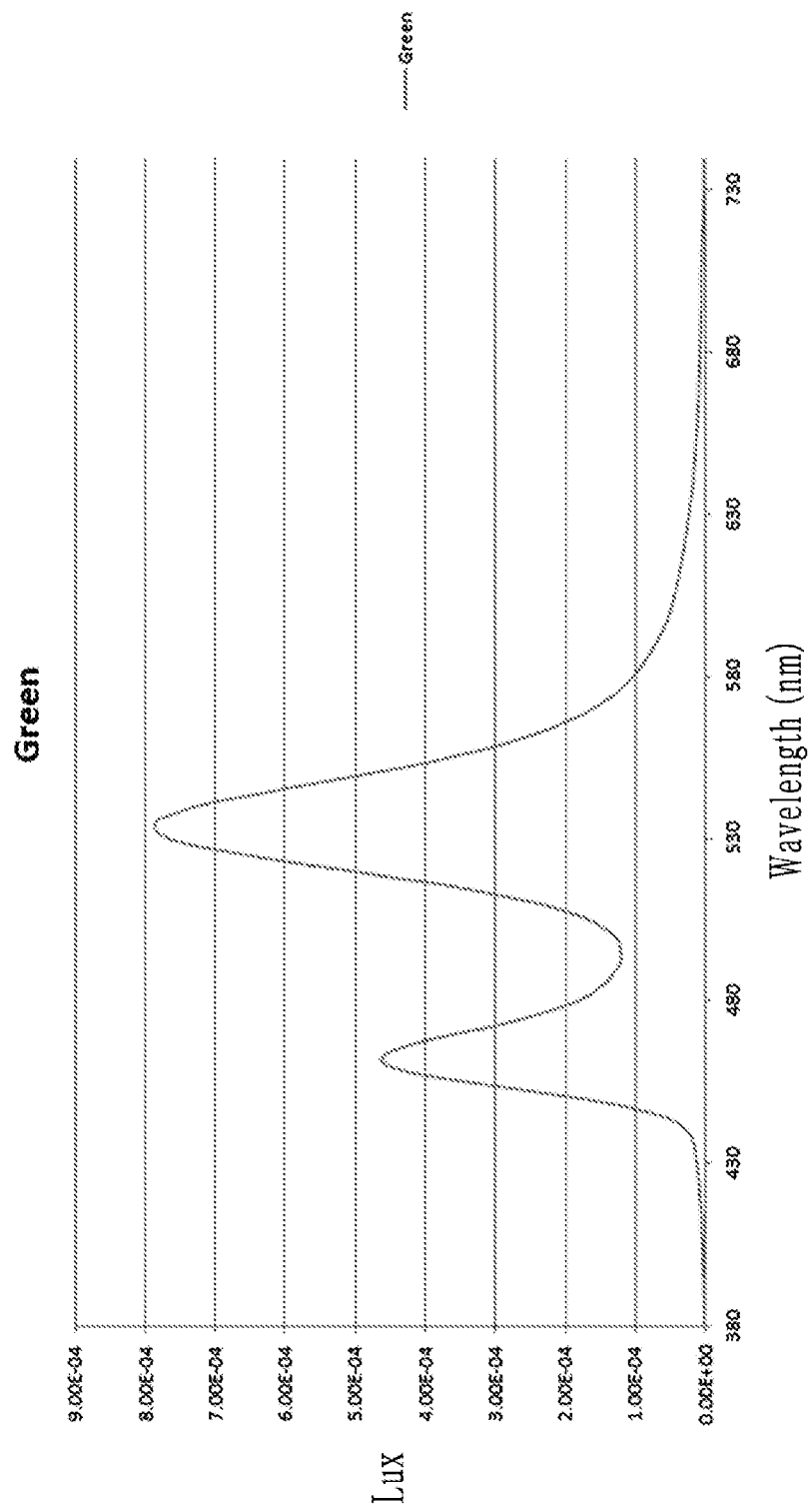
FIG. 5 is a view showing a spectrum of green light.

FIG. 5 shows the spectrum of green light. Referring to FIG. 5, it may be observed that the green light has a wavelength of approximately 430 nm to 680 nm, and a low peak appears near about 470 nm and the high peak appears near about 560 nm.

Figure 6:
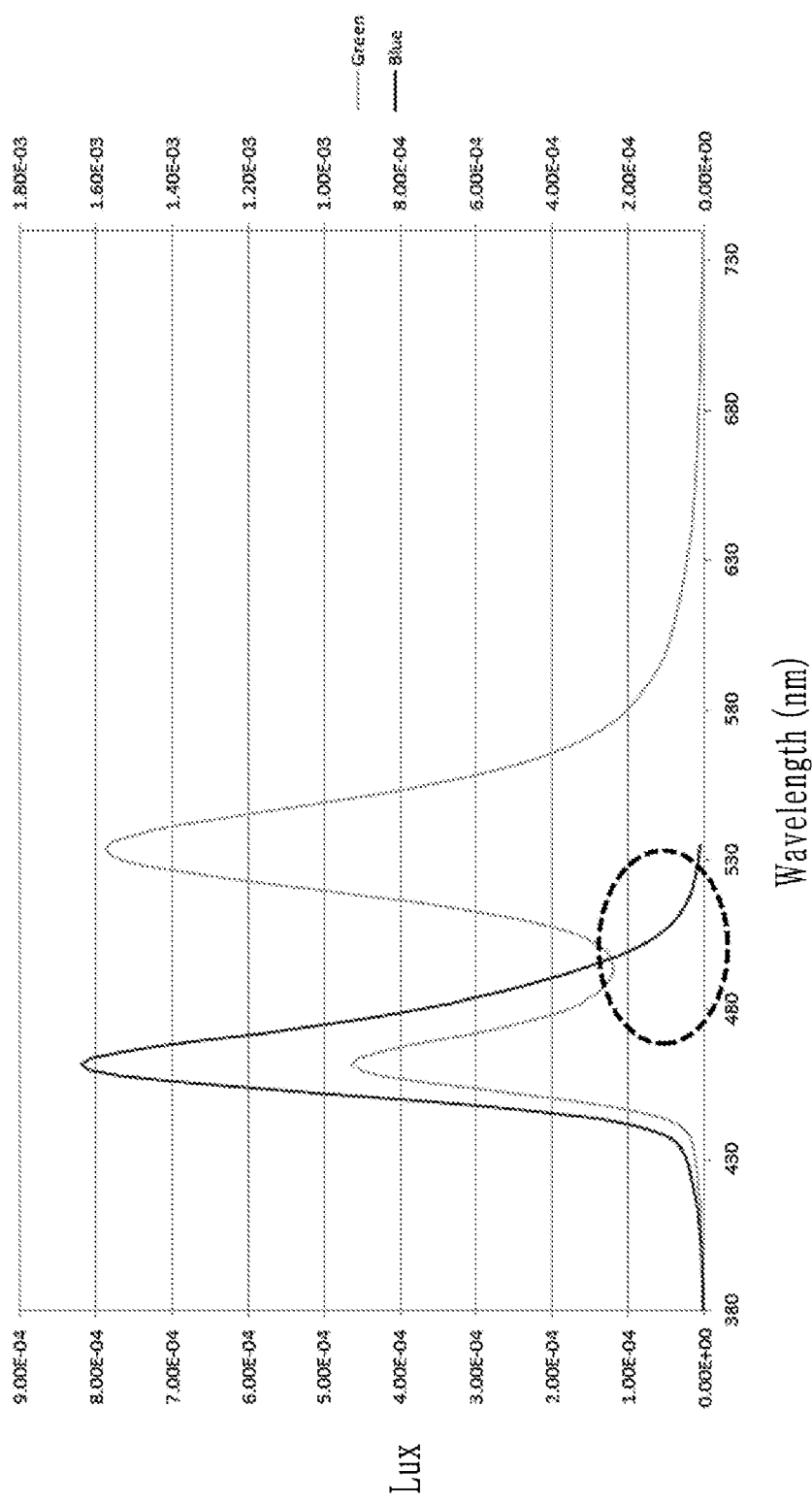
FIG. 6 is a view overlapping a spectrum of blue light of FIG. 4 and a spectrum of green light of FIG. 5.

FIG. 6 shows overlapping of the spectrum of the blue light of FIG. 4 and the spectrum of the green light of FIG. 5. Referring to FIG. 6, in the wavelength region in a range of about 480 nm to about 530 nm, it may be observed that the spectrum of the blue light and the spectrum of the green light are overlapped.

In the color conversion panel according to an embodiment, the transmission layer 330B may include the third quantum dots QD3 and the third quantum dots QD3 that color-convert the incident blue light into the light of the wavelength in a range of about 480 nm to about 530 nm. As observed in FIG. 4, the corresponding wavelength region is a region included in the spectrum of the blue light, and the color conversion by the third quantum dots QD3 does not affect the display quality of the blue light.

As shown in FIG. 2, the quantum dots QD reduce the difference in the front/side luminance while emitting the incident light in all directions, thereby improving the display quality.

Figure 7:
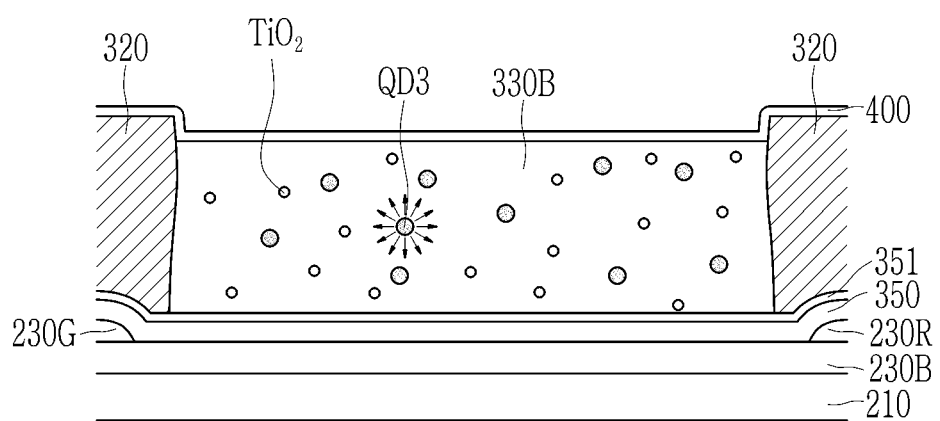
FIG. 7 is a view showing a transmission layer including a scattering member and third quantum dots according to an embodiment.

FIG. 7 shows the transmission layer 330B including the scattering member $TiO_2$ and the third quantum dots QD3 according to an embodiment. As shown in FIG. 7, the scattering member $TiO_2$ changes the direction of the front light through $TiO_2$ to be emitted to the side, thereby increasing the light path at the inside. The third quantum dots QD3 compensate for the deviation due to the difference in the concentration $TiO_2$ for each region while emitting the light in all directions. For example, the display quality may be different as the concentration of $TiO_2$ is different for each region within the transmission layer 330B, but the deviation of the concentration $TiO_2$ may be offset through a Lambertian emission characteristic of the third quantum dots QD3 and a WAD characteristic may be improved.

Also, as above-described, as the third quantum dots QD3 are included in the transmission layer 330B, the thickness of the transmission layer 330B may be thinly formed.

Since the transmission layer 330B transmits the incident blue light, the efficiency increases in case that the thickness of the transmission layer 330B decreases. However, in case that the thickness of the transmission layer 330B decreases in this way, since the optical path inside the transmission layer 330B is shortened, the content of $TiO_2$ must be increased to match the front/side visibility. In case that the content of $TiO_2$ increases in this way, there is a high possibility that the difference in the concentration of $TiO_2$ for each region may occur in the transmission layer 330B, and this may lead to the deterioration of the display quality.

However, in an embodiment, the transmission layer 330B may include the third quantum dots QD3. Accordingly, the luminance difference of the front/side may decrease through the Lambertian emission characteristic of the third quantum dots QD3, and accordingly, the transmission layer 330B may be formed with the thin thickness and efficiency may increase.

Also, since the transmission layer 330B may include the quantum dots like the red color conversion layer 330R or the green color conversion layer 330G, the characteristic change due to the thickness change is similar. Therefore, it is easy to derive the optimum thickness at which the efficiency of the transmission layer 330B, the red color conversion layer 330R, and the green color conversion layer 330G is maximized. In case that the transmission layer 330B does not include the quantum dots, it is not easy to derive a common optimal thickness because the efficiency according to the thickness occurs differently from the red color conversion layer 330R and the green color conversion layer 330G including the quantum dots. However, in an embodiment, since the transmission layer 330B, the red color conversion layer 330R, and the green color conversion layer 330G all include the quantum dots, it is possible to easily derive the optimum thickness.

Figure 8:
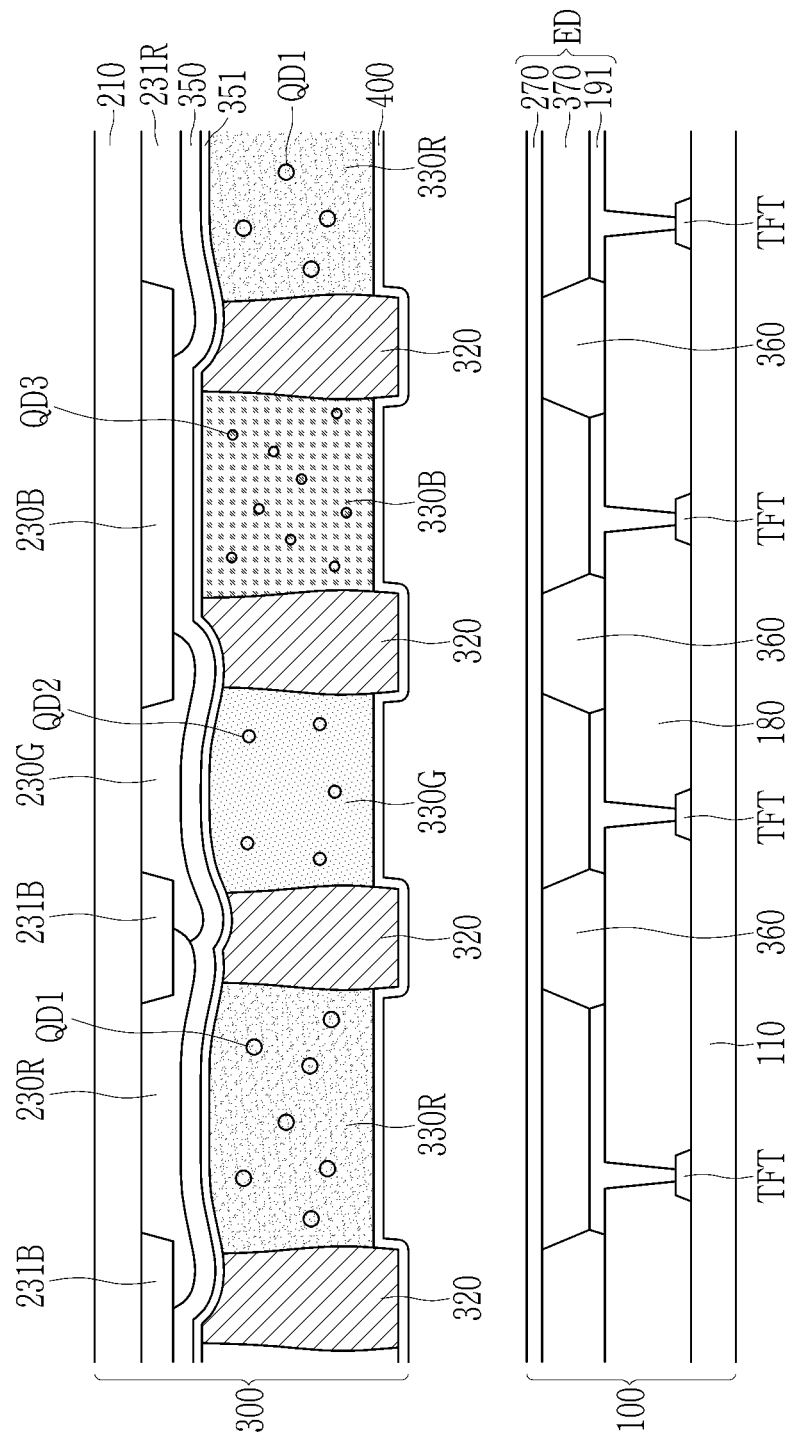
FIG. 8 is a view schematically showing a display device according to an embodiment.

The display device including the color conversion panel 300 according to an embodiment is described with reference to FIG. 8. FIG. 8 is a view schematically showing a display device according to an embodiment.

FIG. 8 may include a display panel 100 and the color conversion panel 300. The display panel 100 may include a second substrate 110, transistors TFT, and an insulating layer 180 disposed on the second substrate 110. A first electrode 191 and a partition wall or bank 360 may be disposed on the insulating layer 180, and the first electrode 191 may be disposed in the opening of the partition wall or bank 360 and may be electrically connected to the transistor TFT. The transistor TFT may include a semiconductor layer, a source electrode, and a drain electrode electrically connected to the semiconductor layer, and a gate electrode insulated from the semiconductor layer. A second electrode 270 may be positioned or disposed on the partition wall or bank 360, and a light-emitting element layer 370 may be positioned or disposed between the first electrode 191 and the second electrode 270. The first electrode 191, the second electrode 270, and a light-emitting element layer 370 may be collectively referred to as a light-emitting element ED.

The description for the color conversion panel 300 is the same as that of FIG. 1. The detailed description of the same constituent elements is omitted. For example, the blue color filter 230B, the dummy color filter 231B, the red color filter 230G, and the green color filter 230R may be positioned or disposed on the second substrate 210.

The low refraction layer 350 and the low refraction capping layer 351 may be disposed on the color filters 2308, 230G, and 230B and the dummy color filter 231B. The red color conversion layer 330R, the green color conversion layer 330G, and the transmission layer 330B may be positioned or disposed on the low refraction capping layer 351. The light blocking member 320 is disposed between the red color conversion layer 330R, the green color conversion layer 330G, and the transmission layer 330B.

The light blocking member 320 of the color conversion panel 300 may overlap the partition wall or bank 360 of the display panel 100 in the direction perpendicular to the surface of the first substrate 210. Also, each of the red color conversion layer 330R, the green color conversion layer 330G, and the transmission layer 330B may overlap the light-emitting element ED in the direction perpendicular to the surface of the first substrate 210.

As above-described, the transmission layer 330B may include the scattering member $TiO_2$ and the third quantum dots QD3, and the third quantum dots GD3 color-convert the incident light into the light having the wavelength in a range of about 480 nm to about 530 nm. Therefore, by dispersing the light incident on the transmission layer 330B into the front and the side, the difference in the luminance of the front/side may be improved, and the difference in the display quality due to the difference in the content $TiO_2$ for each region may be offset.

While this disclosure has been described in connection with what is considered to be practical embodiments, it is to be understood that the disclosure is not limited to the disclosed embodiments. On the contrary, it is intended to cover various modifications and equivalent arrangements included within the spirit and scope of the disclosure and the appended claims.

What is claimed is:

1. A color conversion panel comprising:
   light blocking members spaced apart from each other on a substrate; and
   a first color conversion layer, a second color conversion layer, and a transmission layer respectively disposed between the light blocking members, wherein
   the transmission layer includes first quantum dots,
   the first quantum dots convert incident light into light having a wavelength in a range of about 480 nm to about 530 nm, and
   a content of the first quantum dots is in a range of about 20 wt % to about 30 wt % of the transmission layer.

2. The color conversion panel of claim 1, wherein
   the second color conversion layer includes second quantum dots, and
   the second quantum dots convert the incident light into light having a wavelength in a range of about 430 nm to about 680 nm.

3. The color conversion panel of claim 2, wherein
   the first color conversion layer includes third quantum dots, and
   the third quantum dots convert the incident light into light having a wavelength in a range of about 600 nm to about 650 nm.

4. The color conversion panel of claim 3, wherein
   a content of the first quantum dots included in the transmission layer is less than a content of the second quantum dots included in the second color conversion layer and a content of the third quantum dots included in the first color conversion layer.

5. The color conversion panel of claim 3, wherein
   the first color conversion layer, the second color conversion layer, and the transmission layer further include a scattering member, respectively, and
   a content of the scattering member included in the first color conversion layer and a content of the second color conversion layer is less than the content of the scattering member of the transmission layer.

6. The color conversion panel of claim 5, wherein the scattering member includes $TiO_2$.

7. The color conversion panel of claim 3, wherein
   a size of the first quantum dots is smaller than a size of the second quantum dots, and
   the size of the second quantum dots is smaller than a size of the third quantum dots.

8. The color conversion panel of claim 1, wherein
   the transmission layer further includes $TiO_2$, and
   a content of the $TiO_2$ is in a range of about 5 wt % to about 6 wt % of the transmission layer.

9. The color conversion panel of claim 1, further comprising:
   a first color filter disposed between the substrate and the first color conversion layer;
   a second color filter disposed between substrate and the second color conversion layer; and
   a third color filter disposed between the substrate and the transmission layer.

10. The color conversion panel of claim 9, further comprising:
    a dummy color filter overlapping the light blocking members in a direction perpendicular to a surface of the substrate, the dummy color filter and the third color filter being disposed on a same layer, wherein
    the third color filter and the dummy color filter are blue color filters.

11. The color conversion panel of claim 1, further comprising:
    a low refraction layer disposed between the first, second, and third color filters, and the first and second color conversion layers and the transmission layer.

12. The color conversion panel of claim 11, further comprising:

a low refraction capping layer contacting the low refraction layer.

13. A display device comprising:
a color conversion panel; and
a display panel overlapping the color conversion panel, wherein
the display panel emits a blue light, and
the color conversion panel includes:
light blocking members spaced apart from each other on a substrate; and
a first color conversion layer, a second color conversion layer, and a transmission layer respectively disposed between the light blocking members,
the transmission layer includes first quantum dots,
the first quantum dots convert the blue light from the display panel into light having a wavelength in a range of about 480 nm to about 530 nm, and
a content of the first quantum dots is in a range of about 20 wt % to about 30 wt % of the transmission layer.

14. The display device of claim 13, wherein
the second color conversion layer includes second quantum dots,
the second quantum dots convert the incident blue light into a light having a wavelength in a range of about 480 nm to about 560 nm,
the first color conversion layer includes third quantum dots, and
the third quantum dots convert the incident blue light into light having a wavelength in a range of about 600 nm to about 650 nm.

15. The display device of claim 14, wherein a content of the first quantum dots included in the transmission layer is less than a content of the second quantum dots included in the second color conversion layer and a content of the third quantum dots included in the first color conversion layer.

16. The display device of claim 14, wherein
the first color conversion layer, the second color conversion layer, and the transmission layer further include a scattering member, respectively, and
a content of the scattering member included in the first color conversion layer and a content of the second color conversion layer is less than a content of the scattering member of the transmission layer.

17. The display device of claim 14, wherein
a size of the first quantum dots is smaller than a size of the second quantum dots, and
the size of the second quantum dots is smaller than a size of the third quantum dots.

18. The display device of claim 13, wherein
the transmission layer further includes $TiO_2$, and
a content of the $TiO_2$ is in a range of about 5 wt % to about 6 wt % of the transmission layer.

* * * * *